(12) United States Patent
Aman et al.

(10) Patent No.: US 6,178,530 B1
(45) Date of Patent: Jan. 23, 2001

(54) ADDRESSING SCHEME FOR CONVOLUTIONAL INTERLEAVER/DE-INTERLEAVER

(75) Inventors: Ahmad K. Aman, Fairfax, VA (US); Hermann J. Weckenbrock, Bordentown, NJ (US)

(73) Assignee: Lucent Technologies Inc., Murray Hill, NJ (US)

( * ) Notice: Under 35 U.S.C. 154(b), the term of this patent shall be extended for 0 days.

(21) Appl. No.: 09/065,854

(22) Filed: Apr. 24, 1998

(51) Int. Cl.[7] .................................................. G11C 29/00
(52) U.S. Cl. ......................... 714/702; 714/786; 711/157
(58) Field of Search .................... 714/702–704, 714/786; 711/220, 157, 212

(56) References Cited

U.S. PATENT DOCUMENTS

| | | | |
|---|---|---|---|
| 5,241,563 | 8/1993 | Paik et al. .............................. | 375/200 |
| 5,313,606 | * 5/1994 | Luong et al. .......................... | 395/425 |
| 5,530,837 | * 6/1996 | Williams et al. ..................... | 711/157 |
| 5,537,420 | 7/1996 | Huang .................................... | 714/701 |
| 5,572,532 | 11/1996 | Fimoff et al. ......................... | 714/702 |
| 5,659,698 | * 8/1997 | Weng et al. .......................... | 711/220 |
| 5,928,371 | * 7/1999 | Robinson, Jr. et al. ............. | 714/702 |

OTHER PUBLICATIONS

Advanced Television Systems Committee (ATSC), ATSC Digital Television Standard, Doc. A/53 (1995), pp. 49–50.

ATSC, Guide to the use of the ATSC Digital Television Standard, Doc. A/54 (1995). p. 118.

* cited by examiner

Primary Examiner—Albert De Cady
Assistant Examiner—Guy J. Lamarre
(74) Attorney, Agent, or Firm—Law Office of Leo Zucker

(57) ABSTRACT

A memory addressing scheme suitable for use for either interleaving or de-interleaving data bytes of, e.g., a broadcast digital television (DTV) data stream. A number of memory branches are configured in a random access memory (RAM), wherein at least some of the branches have different numbers of memory locations for reading out and for storing data bytes, thus defining memory branches of different lengths in the RAM. A start address is determined for each of the memory branches in the RAM, corresponding to a first memory location of each branch. An offset value is determined for each memory branch, to be added to the start address for the branch for addressing a memory location of the branch. If an offset value does not exceed the length of a corresponding branch, an address corresponding to the sum of the branch start address and the offset value is generated for addressing a successive memory location of the branch, and the offset value for the branch is incremented by one. When an offset value equals the length of a corresponding branch, an address corresponding to a last memory location of the branch is generated, and the offset value for the branch is reset to zero.

12 Claims, 9 Drawing Sheets

CONVOLUTIONAL INTERLEAVER (BYTE SHIFT REGISTER ILLUSTRATION)

FIG. 3
CONVOLUTIONAL INTERLEAVER

| ROW # | LENGTH | MEMORY ADDRESS |
|---|---|---|
| 1 | 4 | 0 1 2 3 |
| 2 | 8 | 4 5 6 7 8 9 10 11 |
| 3 | 12 | 12 13 14 15 16 17 18 19 20 21 22 23 |
| 4 | 16 | 24 25 26 27 ... 36 37 38 39 |
| 5 | 20 | 40 41 42 ... 56 57 58 59 |
| 6 | 24 | 60 61 ... |
| ... | ... | ... |
| 49 | 196 | 4704 4705 4706 ... 4898 4899 |
| 50 | 200 | 4900 4901 4902 ... 5095 5096 5097 5098 5099 |
| 51 | 204 | 5100 5101 5102 5103 5104 ... 5297 5298 5299 5300 5301 5302 5303 |

FIG. 4
CONVOLUTIONAL DE-INTERLEAVER

| ROW # | LENGTH | MEMORY ADDRESS | | | | | | | | | |
|---|---|---|---|---|---|---|---|---|---|---|---|
| | | 0 | 1 | 2 | 3 | 4 | 5 | 6 | 7 | 8 | 9 |
| 1 | 204 | | | | | | | | 197 | 198 | 199 200 201 202 203 |
| 2 | 200 | 204 | 205 | 206 | 207 | 208 | → | | | 398 | 399 400 401 402 403 |
| 3 | 196 | 404 | 405 | 406 | 407 | → | | | 596 | 597 | 598 599 |
| 4 | 192 | 600 | 601 | 602 | → | | | 788 | 789 | 790 | 791 |
| 5 | 188 | 792 | 793 | → | | | 959 | | | | |
| 6 | 184 | 960 | 961 | • | | | | | | | |
| • | • | • | • | • | | | | | | | |
| 49 | 12 | 5280 | 5281 | → | | | | | 5288 | 5289 | 5290 5291 |
| 50 | 8 | 5292 | 5293 | 5294 | 5295 | 5296 | 5297 | 5298 | 5299 | | |
| 51 | 4 | 5300 | 5301 | 5302 | 5303 | | | | | | |

ADDRESSING SCHEME FOR CONVOLUTIONAL INTERLEAVER/DE-INTERLEAVER

BACKGROUND OF THE INVENTION

1. Field of the Invention

This invention relates to a memory addressing scheme suitable for convolutional interleaver and de-interleaver configurations used, e.g., in digital television (DTV) data transmission and reception.

2. Discussion of the Known Art

Noise frequently causes bit errors in digital data transmission systems. To detect and correct such bit errors, several different error correction techniques are known. Interleaving is one method especially effective to cure errors induced by noise bursts, wherein a large number of adjacent bits of a data bit stream may be affected.

An interleaver rearranges the order of data bytes in an original data stream before transmission, by re-locating a certain number of adjacent bytes in the stream according to a defined interleave pattern. At the receiving end, a de-interleaver restores the order of the received data bytes, to obtain the original order of the bytes in the data bit stream.

A recently defined digital television or "DTV" standard for the Unites States prescribes convolutional interleaving to protect broadcast DTV data from noise bursts when the data is transmitted over long distances from a transmitter site to a DTV receiver site. The standard states:

"The interleaver employed in the VSB [vestigial sideband] transmission system shall be a 52 data segment (intersegment) convolutional byte interleaver. Interleaving is provided to a depth of about ⅙ of a data field (4 ms deep). Only data bytes shall be interleaved. The interleaver shall be synchronized to the first data byte of the data field. Intrasegment interleaving is also performed for the benefit of the trellis coding process." Advanced Television Systems Committee (ATSC) Document A/53, Section 4.2.4. The prescribed convolutional interleaver is shown in FIG. 6 of ATSC doc. A/53, and is reproduced in FIG. 1 of the present disclosure.

A data de-interleaver is described in ATSC Document A/54. Section 10.2.3.10 of doc. A/54 states:

"The convolutional de-interleaver performs the exact inverse function of the transmitter convolutional interleaver. Its ⅙ data field depth, and intersegment "dispersion" properties allow noise bursts lasting about 193 microseconds to be handled. Even strong NTSC co-channel signals passing through the NTSC rejection filter, and creating short bursts due to NTSC vertical edges, are reliably handled due to the interleaving and RS [Reed-Solomon] coding process. The de-interleaver uses Data Field Sync for synchronizing to the first data byte of the data field." The prescribed de-interleaver is shown in FIG. 10.14 of ATSC doc. A/54 and is reproduced in FIG. 2 of the present disclosure.

All relevant portions of both ATSC Documents A/53 and A/54 are incorporated by reference herein.

As seen in FIGS. 1 and 2, a typical convolutional interleaver/de-interleaver for accommodating the DTV standard, requires 51 branches each comprised of a different number of byte shift registers. The known approach requires 51 independent counters to keep track of I/O addresses for each branch, an 8-bit wide 52×1 input de-multiplexer, an 8-bit wide 52×1 output multiplexer, and the required I/O selection circuitry. This approach thus requires a relatively large amount of hardware.

U.S. Pat. No. 5,572,532 (Nov. 5, 1996) discloses a convolutional de-interleaver for DTV data, including an address signal generator for repeatedly generating sequences of address signals for a de-interleaving random access memory (RAM). See also U.S. Pat. No. 5,241,563 (Aug. 31, 1993) and U.S. Pat. No. 5,537,420 (Jul. 16, 1996).

SUMMARY OF THE INVENTION

According to the invention, a method of generating successive addresses suitable for carrying out data interleaving or de-interleaving in a data stream using a random access memory (RAM), includes configuring a number of memory branches in a RAM wherein at least some of the branches have different numbers of memory locations for reading out and for storing bytes of a data stream, thus defining memory branches of different lengths in the RAM, determining a start address for each memory branch in the RAM corresponding to a first memory location of each branch, determining for each memory branch an offset value to be added to the start address for the branch for addressing a memory location of the branch, and, if an offset value does not exceed the length of a corresponding branch, generating an address corresponding to the sum of the start address and the offset value for addressing a successive memory location of the branch and incrementing the offset value for the branch by one, and, when an offset value equals the length of a corresponding branch, generating an address corresponding to a last memory location of the branch and resetting the offset value for the branch to zero.

For a better understanding of the invention, reference is made to the following description taken in conjunction with the accompanying drawing and the appended claims.

BRIEF DESCRIPTION OF THE DRAWING

In the drawing:

FIG. 3 is a map of a memory used in a convolutional interleaver according to the invention;

FIG. 4 is a map of a memory used in a convolutional de-interleaver according to the invention;

DETAILED DESCRIPTION OF THE INVENTION

Figure 1:
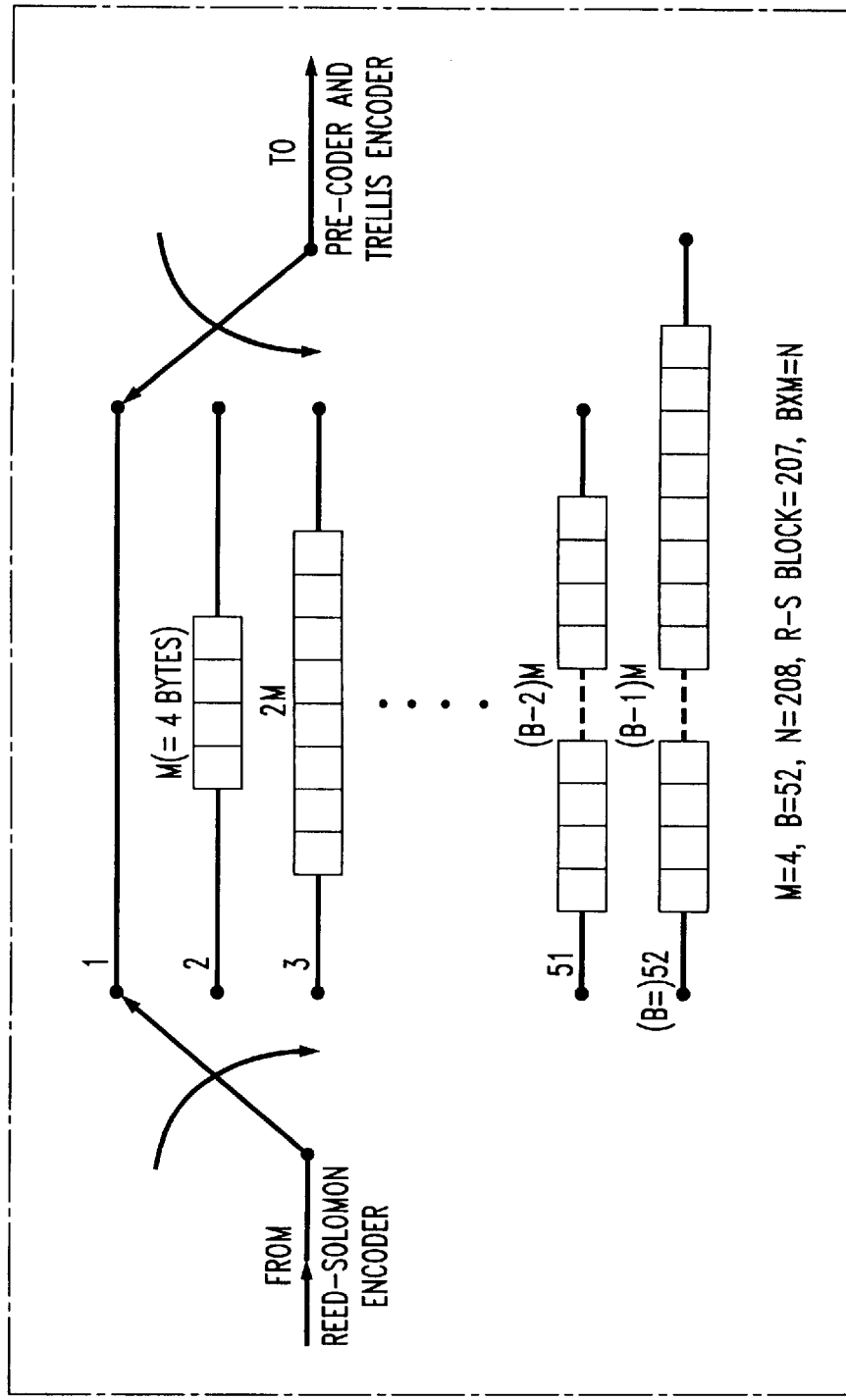
FIG. 1 is a representation of a convolutional interleaver using a byte shift register implementation according to known art.
Figure 2:
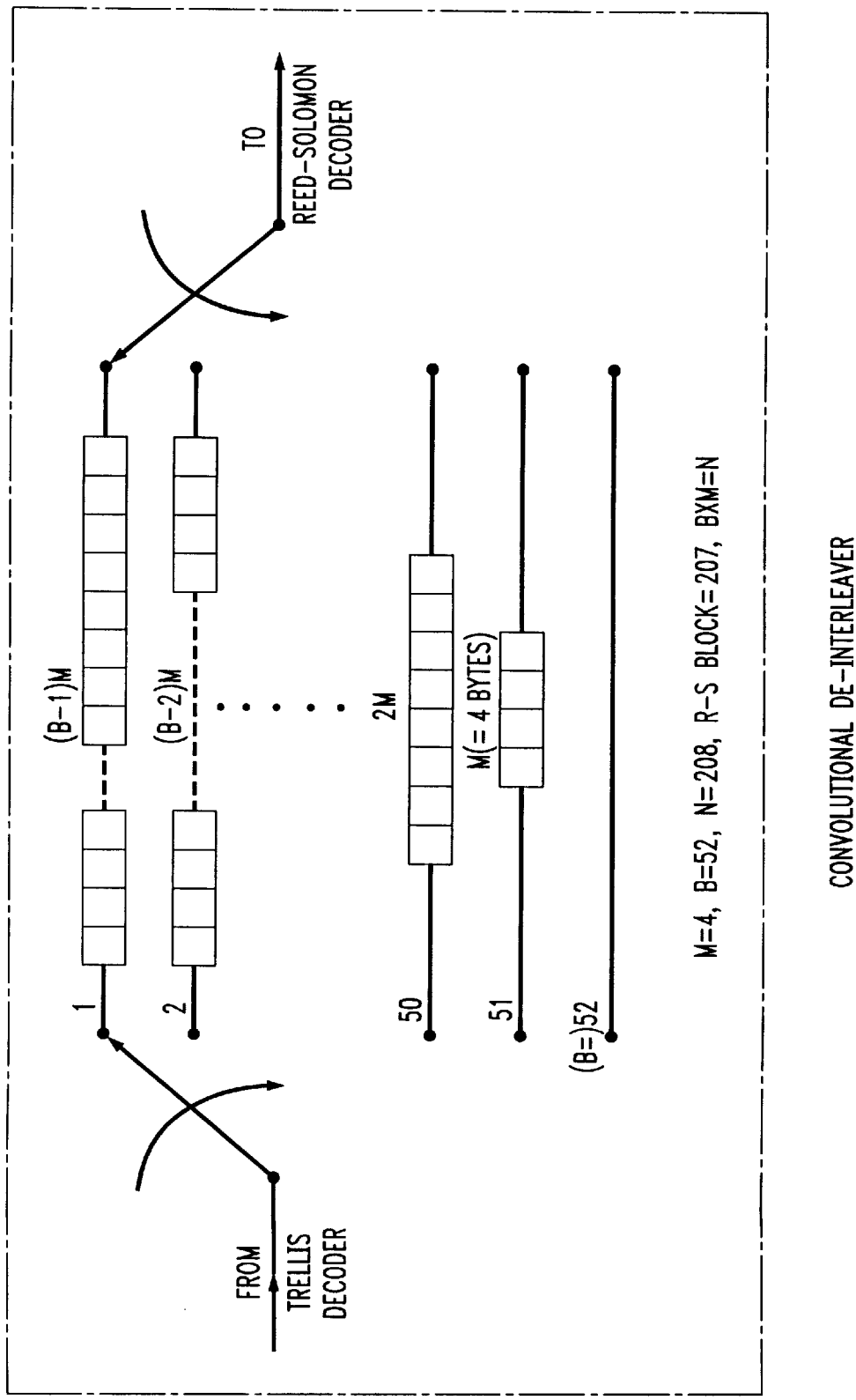
FIG. 2 is a representation of a convolutional de-interleaver using a byte shift register implementation according to known art.

The present invention uses advantageously systematic variations in the number of shift registers in adjacent branches, and corresponding base addresses of the branches, per the prescribed arrangements of FIGS. 1 and 2. Instead of using branches of connected shift registers, the present invention utilizes branches of memory locations defined inside a read/write random access memory (RAM). Such branches may sometimes be referred to as "ring buffers" in the art.

Figure 7:
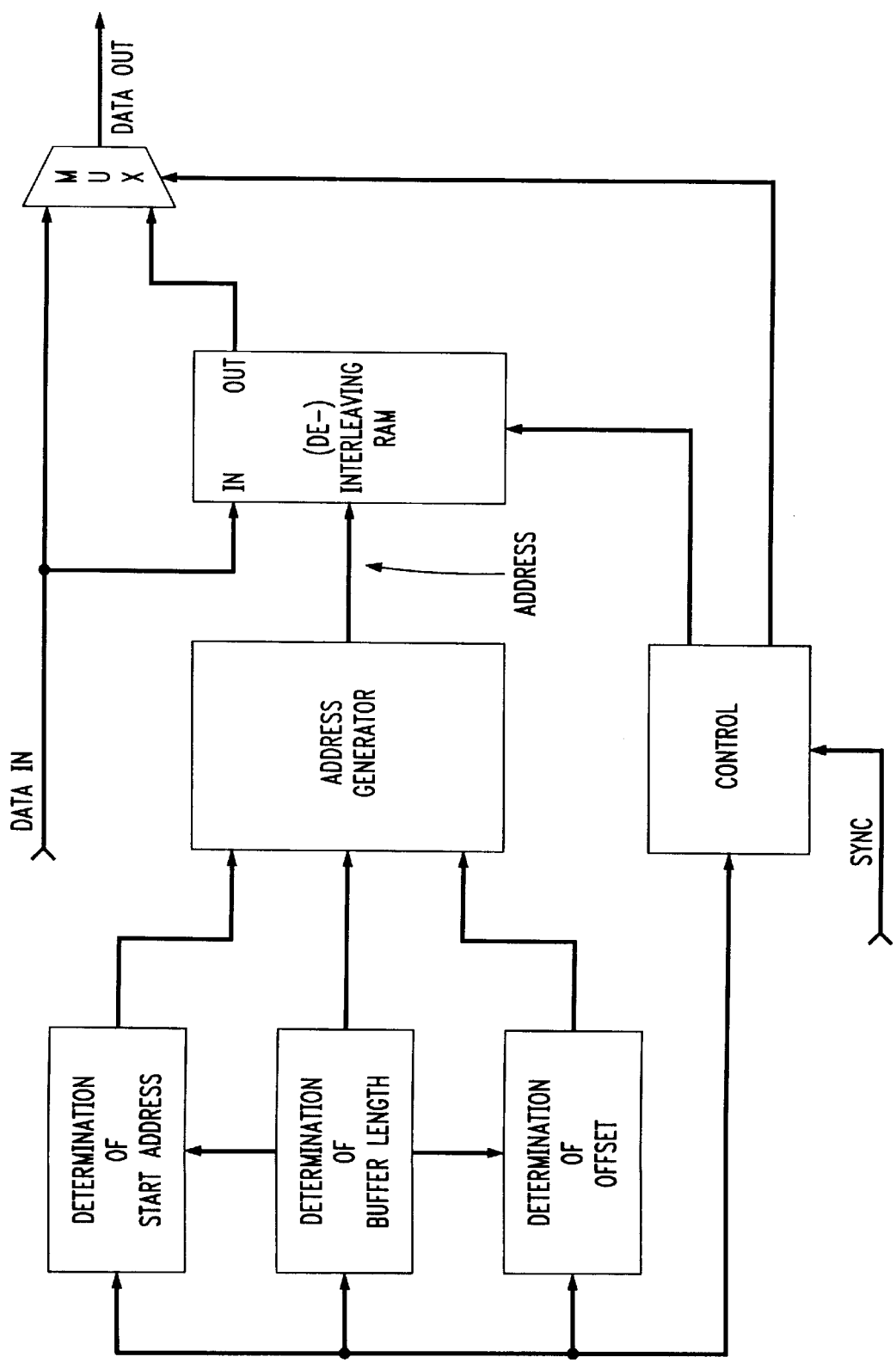
FIG. 7 is a logic block diagram of a memory addressing scheme for a convolutional interleaver and de-interleaver, according to the invention.

New data replaces the oldest at each memory location, and only one counter is required to generate successive read/write addresses for the memory locations in the RAM. Specifically, as depicted in FIG. 7, a length or number of memory locations for each branch is defined, and a base or "start" address for each branch is calculated. And, by using modulo arithmetic, a current address offset relative to the start address for each branch is determined.

An interleaver and a de-interleaver according to the invention each uses, for example, a single 6-bit counter, and only a few adders and flip-flops. Their hardware requirements are therefore relatively small and efficient.

Figure 5A:
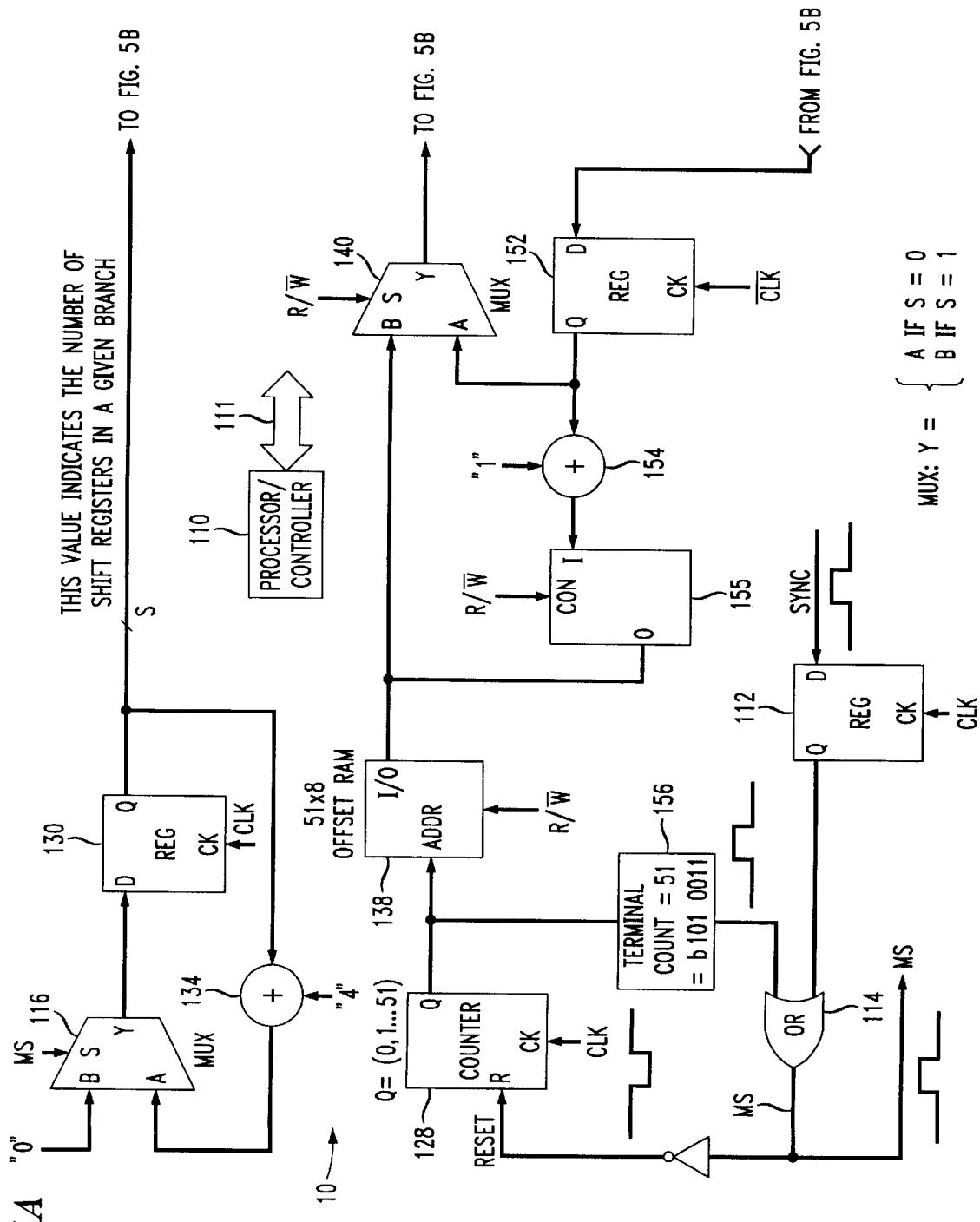
FIGS. 5A and 5B together form a schematic diagram of a convolutional interleaver according to the invention.
Figure 5B:
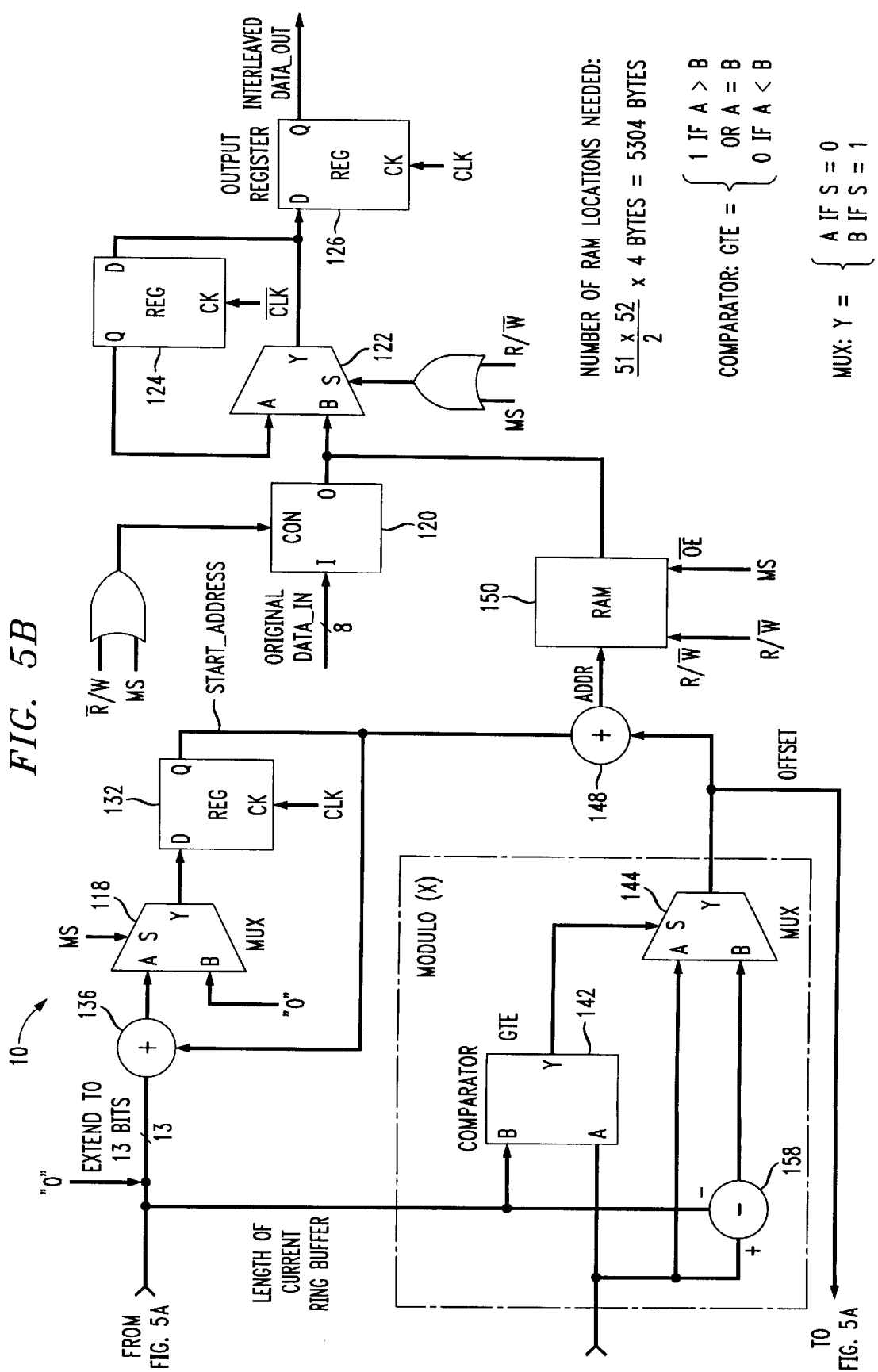
Figure 6A:
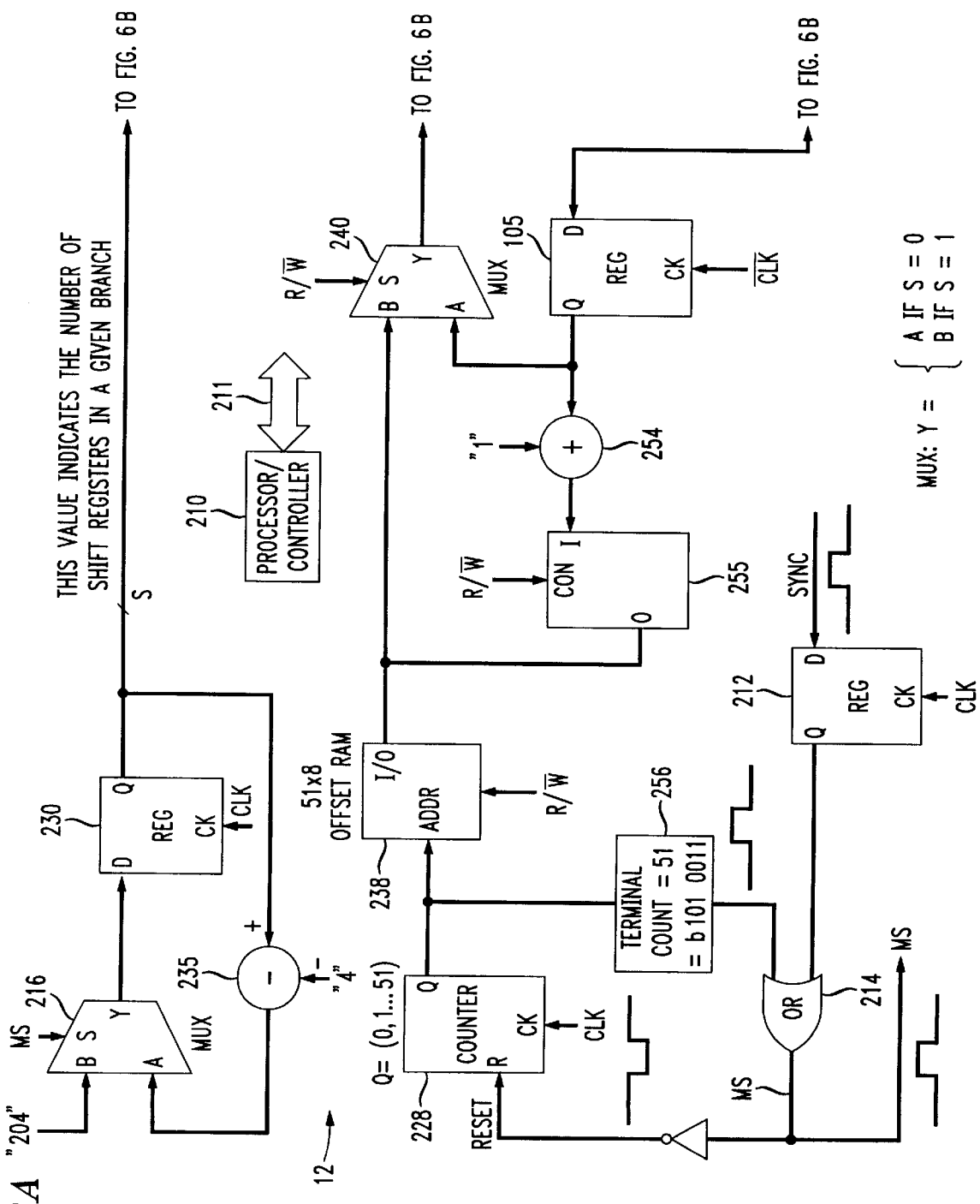
FIGS. 6A and 6B together form a schematic diagram of a convolutional de-interleaver according to the invention.
Figure 6B:
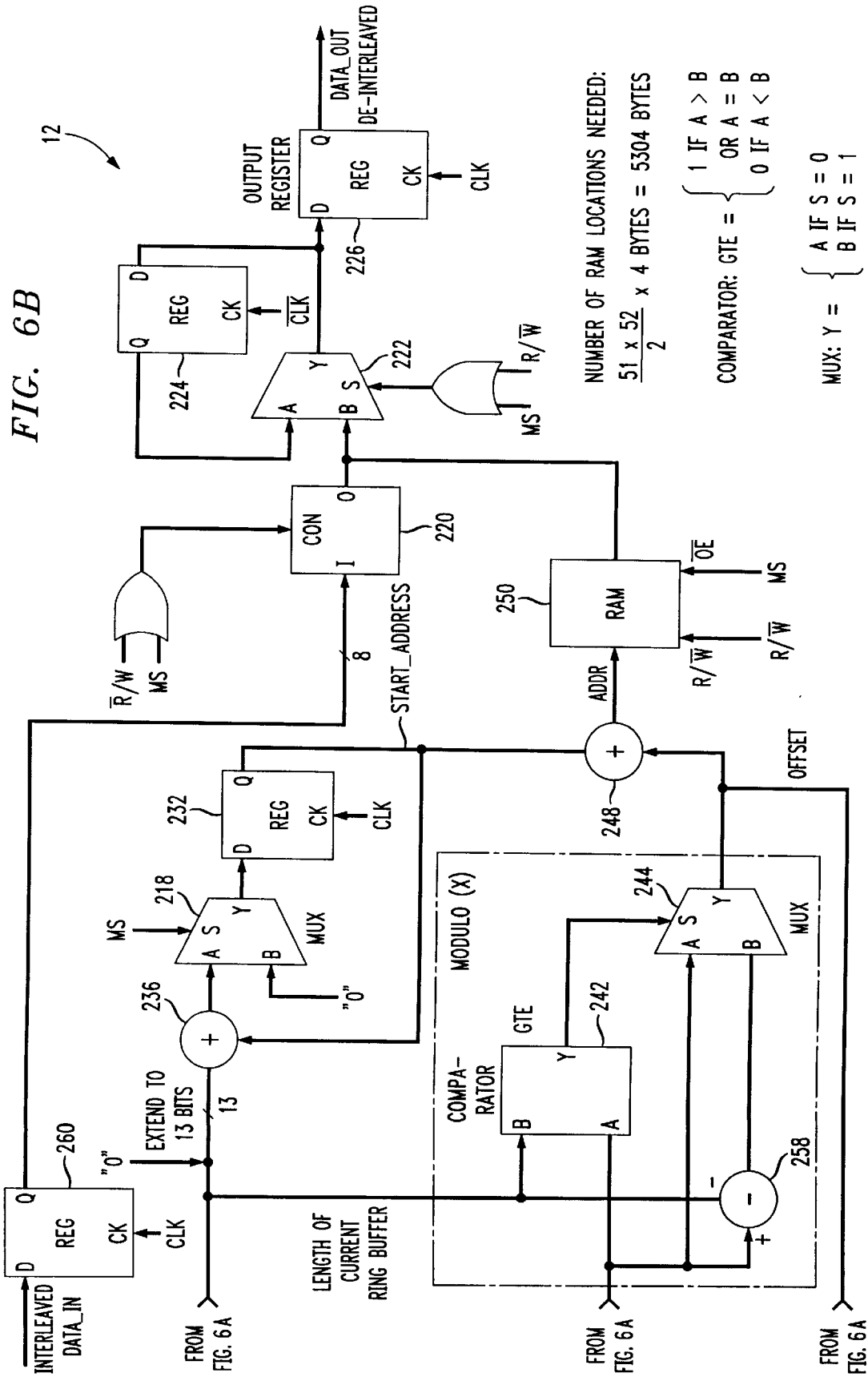

A convolutional interleaver 10 according to the invention is shown in FIGS. 5A and 5B. A convolutional de-interleaver 12 according to the invention is shown in FIGS. 6A and 6B. Major portions of both the interleaver 10 and the de-interleaver 12, include circuitry to generate read/write addresses for memory locations in a corresponding interleaving or de-interleaving RAM.

Addresses for interleaving to be performed at the transmitter site are shown in the Table of FIG. 3. This Table contains 51 rows, corresponding to the 51 rows or branches of shift registers in the configuration of FIG. 1. The first column denotes the row number. The second column represents the length, i.e., the number of shift registers in each row in FIG. 1. From this column it can be seen that the row length always increases by four from one row to the next. The second column is followed by a block representing actual memory addresses.

An important feature of the invention derives from the fact that the sum of the first memory address in a given row and the length of that row, is equal to the first memory address of the following row. Therefore, the addresses in the first column and, consequently, all start or base addresses for memory locations in a RAM adapted to perform an interleaving operation, may be calculated based on this relationship.

In the interleaver 10, a processor/controller 110 operates to supply clock (CLK) signals and to exchange control signals with other components of the interleaver. The processor 110 itself may include a clock signal source, a read-only-memory (ROM) for storing an operating program, and a processor RAM. Processor 110 also incorporates such input/output (I/O) circuitry as may be needed to interface the processor with other components of the interleaver 10, via a bus 111.

A synchronizing pulse SYNC, at the bottom center of FIG. 5A, indicates the beginning of a new data group time period in a data bit stream to be transmitted. The SYNC pulse is applied to an input terminal of a flip-flop or register (REG) 112. An output terminal of REG 112 is coupled to an input terminal of an OR gate (OR) 114. The output of OR gate 114, denoted by MS, thus goes to a logic high in response to the SYNC pulse. The SYNC pulse also resets the interleaver 10 by selecting an input B=0 for a multiplexer (MUX) 116 at the upper left in FIG. 5A, and B=0 for a MUX 118 at the upper left of FIG. 5B. That is, MS is applied to the "S" or "select" terminals of MUX 116 and MUX 118.

The MS output is also coupled to a control terminal of a tri-state buffer 120 and the B-input of a MUX 122, both toward the top of FIG. 5B. The original bit stream DATA IN (e.g., successive 8-bit data bytes) is applied to an input terminal of the tri-state buffer 120. Thus, a first data byte of the bit stream is applied through the buffer 120 and the MUX 122 to an input of a REG 124 coupled between the output and the A-input of MUX 122, and to an input of an output REG 126. At the same time, a counter 128 shown at the left in FIG. 5A, is reset.

After a rising edge of a subsequent clock (CLK) pulse, we have:

"0" at the output of a REG 130, whose input is coupled to the output of MUX 116;

"0" at the output of a REG 132, whose input is coupled to the output of MUX 118;

"0" at the output of counter 128; and a first data byte of the original bit stream DATA IN at the output of output REG 126.

An adder 134, seen at the upper left in FIG. 5A, is set to apply the value "4" to the A-input of MUX 116. After the next clock CLK, MS is low and the value "4" is passed by MUX 116 to REG 130, and the output of REG 130 becomes "4". This output value indicates the number of shift registers in a given branch in the FIG. 1 implementation, and, in the interleaver 10, represents a number of addressable memory locations in each branch of memory locations defined in a interleaving RAM 150 (FIG. 5B).

An adder 136, seen at the upper left in FIG. 5B, adds the outputs of REG 130 and REG 132. Since both outputs were initially "0", the new output of REG 132 is still "0". The counter 128 has increased its output value to "1", which value is applied to an address terminal of an offset RAM 138 seen at the center of FIG. 5A. Assume that a memory cell "1" of offset RAM 138 has initially stored the value "0". The output of the RAM 138 is applied to a B-input terminal of a MUX 140, so that upon a read phase of a present clock cycle, the value "0" is routed through MUX 140 to an A-input of a comparator 142 (FIG. 5B) where it is compared to the output of REG 130 (presently "4") at the B-input of comparator 142. Since A<B, the output of comparator 142 is GTE=0.

The output of comparator 142 drives the select terminal of a MUX 144. Since this output is zero, the MUX 144 passes its A-input, presently "0", to one input of an adder 148. The other input of adder 148 is coupled to the output of REG 132 whose output is also "0". The adder 148 thus produces the sum "0" and applies this value to a read/write address terminal of the interleaving RAM 150. Read/write pulses for the RAM 150 are such that during a first half of a clock cycle, data is read out from an addressed memory location in the memory 150, while during the second half of the cycle data is written into the same addressed memory location. Output data from the RAM 150 is applied to the B-input of MUX 122, to be clocked into the output REG 126.

During the second half or write phase of the first clock cycle, the output of MUX 144 (FIG. 5B) is applied to an input terminal of a REG 152 (FIG. 5A) whose output is incremented by "1" by an adder 154. An output of adder 154 is coupled to an input terminal of a tri-state buffer 155 the output of which is coupled to the I/O port of offset RAM 138 and to the B-input of MUX 140. The output of REG 152 is also coupled to the A-input of MUX 140. The control terminal of buffer 155 is set high only during the first half or read phase of the clock cycle.

The output of buffer 155 is stored as a new value in cell "1" of offset RAM 138. Values stored in RAM 138 via its I/O port thus represent a memory location position to be addressed, relative to the start address of a given memory branch in the interleaving RAM 150.

As mentioned earlier, the output of REG 130 represents the number of shift registers in a given row in the shift register implementation per FIG. 1, or the length (i.e., number of memory locations) in the defined memory branches of the RAM 150 according to the invention. The output of REG 132, on the other hand, represents a first memory location address for a given branch, referred to herein as a "start address". To address all memory locations of the variable length memory branches in the RAM 150, an offset is determined for each branch and is added as a third element when generating successive read/write addresses for the interleaving RAM 150.

One full clock cycle later, the output of REG 130 (previously "4") is increased again by "4" by the adder 134, so that the output of REG 130 becomes "8". Similarly, the output from REG 132 has changed from "0" to "4", and the output of counter 128 has changed from "1" to "2". Again, assume that an offset RAM memory cell addressed by the counter 128, now cell "2", has stored the value "0". As before, this value is passed through MUX 140 and the A-input of MUX 144 to adder 148, where it is added to the output of REG 132 which is now "4". Hence, the new read/write address generated for the interleaving RAM 150 is "4", which is the start address of the second row or branch of memory locations in RAM 150 as seen in FIG. 3.

A terminal count stage 156 is coupled between the output of counter 128 and another input of OR gate 114 in FIG. 5A. When a terminal count reaches "51", the stage output goes high and the counter 128 is reset to zero. At this time, all the base addresses corresponding to the first column of memory addresses (0, 4, 12, . . . , 5100) in FIG. 3 have been successively generated. The first data byte of a second group of original data bytes applied as DATA IN to the tri-state buffer 120, is sent directly to the output register 126, and the next 51 data bytes of the second group are written into the RAM 150. This time, however, the offset value is "1" which is added to the start address by adder 148 when generating read/write addresses for RAM 150, assuming that all cells of offset RAM 138 initially stored the value "0". Thus, all addresses corresponding to the second column of memory addresses (1, 5, 13, . . . , 5101) in FIG. 3 are successively generated.

After the addresses for the first four columns of memory addresses in FIG. 3 are generated, the offset value becomes "4". This value is sent via MUX 140 to the A-input of comparator 142. Comparing this value to the B-input of comparator 142, which is also "4", produces a logic high at the output of comparator 142, resulting in the selection of the B-input of MUX 144. A subtractor 158 has its output coupled to the B-input of MUX 144, its plus terminal coupled to the output of MUX 140, and its minus terminal coupled to the output of REG 130.

The output of subtractor 158 thus represents the difference between the present offset value ("4") and the length of a particular branch or row (e.g., "4" for row 1), resulting in the value "0" which is then stored as a new value of cell 1 in the offset RAM 138. Thus, the value at a particular cell in the offset RAM 138 is reset to "0" once the maximum length of a corresponding memory branch is reached. For example, once an address corresponding to a last memory location in row 1 is generated, i.e., address 3 in FIG. 3, a data byte is read out from the addressed location and a new data byte is written to the same location. The offset value for row 1 is then reset to zero, so that the next time an address for a row 1 memory location is generated, the address is determined by adding the row's start address (0) to the row's offset value (0), to obtain a memory address of "0". The offset values for the remaining rows in FIG. 3 will not be reset to "0" until they each become equal to the length of the corresponding row. Thus, the next address to be generated for a row 2 memory location is "8" (sum of row 2 start address of 4, and row 2 offset of 4).

The assumption that all memory cells of offset RAM 138 originally store the value "0", makes it easier to explain how read/write addresses for the interleaving RAM 150 are generated. Actually, the memory cells of offset RAM 138 may contain any value. This simply means that the read/write addressing of memory locations in the RAM 150 need not start with a "first" memory location, but with any given location in a particular memory branch. Address generation will continue to cycle though the memory location addresses until the end of each succeeding memory branch is reached. Then, the address generation for the RAM 150 is reset to zero and continues until reaching the given memory location where the cycle commenced. Accordingly, all read/write addresses required for the RAM 150 to implement the desired data interleaving operation, are generated.

The convolutional de-interleaver 12 of FIGS. 6A and 6B operates to rearrange data that has been interleaved by the interleaver 10, so that the original order of the data is restored. A Table of memory addresses for a de-interleaving RAM 250, which is used to restore the interleaved data, is shown in FIG. 4. Elements of the de-interleaver 12 that correspond to elements of the interleaver 10, have corresponding reference numerals increased by 100. As shown in FIGS. 6A and 6B, the de-interleaver 12 is almost identical in construction to the interleaver 10 of FIGS. 5A and 5B but operates with a reversed addressing scheme, as shown in FIG. 4.

In the de-interleaver 12, circuitry that determines memory branch lengths comprising MUX 216, REG 230, and subtractor 235 (rather than adder 134 in the interleaver 10), is initialized for the longest (rather than the shortest) memory branch, namely, 204 memory locations in the illustrated embodiment. The sequence of lengths from "204" down to the shortest branch, namely "4" memory locations, is obtained by repeatedly subtracting "4" by operation of the subtractor 235.

In FIG. 6B, adder 236, MUX 218, and REG 232 calculate a starting address, i.e., a memory address corresponding to the first column of memory addresses in FIG. 4. Adding an offset via an output of MUX 244 to this starting address produces a sequence of read/write memory addresses for the de-interleaving RAM 250.

In the interleaver 10, the first byte of a data block is routed straight through the interleaver to the output register 126. In the de-interleaver 12, on the other hand, the first byte of a received data block is directed into the de-interleaving RAM 250, and the last, rather than the first, byte of the data block is sent directly to the output register 226. This can be achieved without changing the control circuitry, simply by delaying incoming data bytes of an interleaved DATA IN bit stream by one clock cycle. For example, the DATA IN stream can be applied to an input terminal of a REG 260, an output terminal of which is coupled to the "A" input of MUX 220 in FIG. 6B.

If applied to carry out data interleaving per the mentioned DTV standard, the interleaver 10 and the de-interleaver 12 must be configured to operate only on valid data, not on a data segment sync or a data field sync in the case of DTV. Therefore, during those periods when no valid data is transmitted, the circuits 10, 12 may, for example, be disabled via conventional means known to those skilled in the art.

While the foregoing description represents preferred embodiments of the invention, it will be obvious to those skilled in the art that various changes and modifications may be made, without departing from the true spirit and scope of the invention pointed out by the following claims.

We claim:

1. A method of generating successive addresses suitable for carrying out data interleaving or de-interleaving in a data stream using a random access memory (RAM), comprising:

configuring a number of memory branches in a given interleaving or de-interleaving RAM wherein the branches have different numbers of memory locations for reading out and for storing bytes of a data stream, thus defining memory branches of different lengths in the given RAM;

determining the length of a given memory branch by using a first adder;

determining a start address for a given memory branch in the RAM corresponding to a first memory location of the given branch, by using a second adder that adds the length and the start address of a previous branch;

determining for each memory branch corresponding offset values, and storing the offset values in an offset RAM;

addressing a memory location in a given memory branch by using a third adder that adds the start address for the given branch to a current offset value stored in the offset RAM for the given branch; and if the current offset value does not exceed the length of the given memory branch, generating an address corresponding to the sum of the branch start address and the current offset value for addressing a successive memory location of the branch, and incrementing the offset value for the branch by one; and when the current offset value equals the length of the given memory branch, generating an address corresponding to a last memory location of the branch, and resetting the offset value for the branch to zero.

2. The method of claim 1, including incrementing an offset value initially set for each memory branch by "1" each time an address for a memory location in the branch is generated.

3. The method of claim 2, including re-setting a determined offset value for a given branch to "0" after an offset value determined for the given branch exceeds the length of the branch.

4. The method of claim 1, including reading out from the given RAM a data byte of the data stream stored at a memory location corresponding to a generated address during a first phase of a clock cycle, and writing another data byte of the data stream into said memory location during a second phase of said clock cycle.

5. The method of claim 1, including reading out from the offset RAM an offset value stored at a memory cell corresponding to a selected memory branch in the given RAM during a first phase of a clock cycle, and writing an updated offset value for the selected memory branch into said memory cell of the offset RAM during a second phase of said clock cycle.

6. The method of claim 1, including repeatedly generating a number of addresses in an order corresponding to an order of the memory branches configured in the given RAM, wherein each generated address corresponds to one memory location of the corresponding memory branch.

7. The method of claim 1, including reading out from the given RAM a stored data byte of the data stream during a clock cycle and supplying the stored data byte at an output of a corresponding interleaver or de-interleaver circuit, and passing another data byte of the data stream directly to the output of the circuit during another clock cycle.

8. A convolutional interleaver/de-interleaver circuit for interleaving/de-interleaving data bytes of a data stream, comprising:

a processor configured to exchange control signals with other components of the circuit;

a random access memory (RAM) configured to have a number of memory branches, wherein the branches have different numbers of memory locations for reading out and for storing bytes of a data stream applied to an input of the circuit, thus defining memory branches of different lengths in the RAM;

a memory branch length determination stage including a first adder configured to determine the number of memory locations in each of the memory branches in the RAM;

a start address determination stage including a second adder configured to determine a start address corresponding to a first memory location of a given memory branch in the RAM by adding the length and the start address of a previous branch; and an offset value determination stage configured to determine for each memory branch corresponding offset values, and an offset RAM arranged to store a current offset value for each branch; and an address generation stage including a third adder and coupled to the memory branch length, the start address, and the offset value determination stages, and configured to address a memory location in a given memory branch in the RAM by adding the start address for the given branch to a current offset value stored in the offset RAM for the given branch wherein, if the current offset value determined for the given branch does not exceed the length of the branch, an address is generated which corresponds to the sum of the branch start address the current offset value, and, when the current offset value determined for the given branch equals the length of the branch, an address is generated which corresponds to a last memory location of the branch, and the current offset value for the branch is reset to zero.

9. The circuit of claim 8, wherein said processor is configured to read out from the de-interleaving RAM a byte of the interleaved data stream stored at a memory location corresponding to a generated address during a first phase of a clock cycle, and to write another data byte of the data stream into said memory location during a second phase of said clock cycle.

10. The circuit of claim 8, wherein said processor is configured to read out from the offset RAM an offset value stored at a memory cell corresponding to a selected memory branch in the de-interleaving RAM during a first phase of a clock cycle, and to write an updated offset value for the selected memory branch into said memory cell during a second phase of said clock cycle.

11. The circuit of claim 8, wherein said address generation stage is configured to generate repeatedly a number of addresses in an order corresponding to an order of the memory branches configured in the de-interleaving RAM, such that each generated address corresponds to one memory location of the corresponding memory branch.

12. The circuit of claim 8, including a multiplexer coupled to the de-interleaving RAM and to a circuit input, wherein the multiplexer is configured to output data bytes of an input interleaved data stream which bytes are read out from addressed memory locations of the RAM during a number of clock cycles, and to output at least one data byte of the input data stream directly during at least one other clock cycle to produce a de-interleaved data stream.

* * * * *